United States Patent [19]
Scheibler

[11] Patent Number: 6,043,992
[45] Date of Patent: Mar. 28, 2000

[54] ELECTROMAGNETICALLY SCREENING PLUG-IN MODULES FOR ELECTRONIC RACKS

[75] Inventor: Eduard Scheibler, Wetzikon, Switzerland

[73] Assignee: ELMA Electronics AG, Wetzikon, Switzerland

[21] Appl. No.: 08/864,867

[22] Filed: May 12, 1997

[30] Foreign Application Priority Data

May 23, 1996 [EP] European Pat. Off. .............. 96810331

[51] Int. Cl.[7] ....................................... H05K 5/04
[52] U.S. Cl. .......................... 361/818; 361/728; 361/730; 361/725; 361/726; 174/66; 174/356 C; 174/35 R
[58] Field of Search ..................................... 361/818, 728, 361/729, 730, 725, 726, 732; 174/66, 35 GC, 35 R

[56] References Cited

U.S. PATENT DOCUMENTS

| | | |
|---|---|---|
| 5,175,395 | 12/1992 | Moore ..................................... 174/35 R |
| 5,208,734 | 5/1993 | Someno ................................... 361/706 |
| 5,323,298 | 6/1994 | Shatas et al. ............................ 361/816 |
| 5,495,399 | 2/1996 | Gore et al. ............................... 361/814 |

*Primary Examiner*—Leo P. Picard
*Assistant Examiner*—David Foster
*Attorney, Agent, or Firm*—Townsend and Townsend and Crew LLP

[57] ABSTRACT

The invention disclosed module carriers for electromagnetically screened, plug-in modules, which carry a front plate (2) which in turn has U-shaped limbs (3, 3', 4, 4') with lateral spring elements (5) for the screening. Through use of a suitable metallic sheet, and through a geometrical design of the limbs (3, 4) and of the spring elements (6, 17) matched thereto, it is possible to cut out and bend screening plates (10, 10'), limbs (3, 4) and spring elements (6, 17) in one piece from the sheet metal. If one can decide to adopt standardized limbs (3, 4) and spring elements (6, 17) with corresponding bending tools and if the cutting out is, for example, effected under numerical control with a laser on a sheet of stainless metal, then a high flexibility arises for different dimensions of the front plates (2) and rational manufacturing is possible even with small batch sizes.

14 Claims, 3 Drawing Sheets

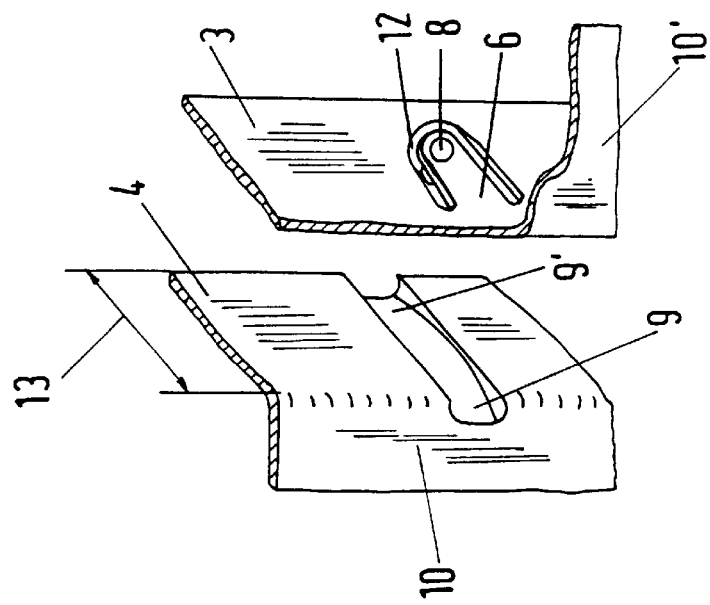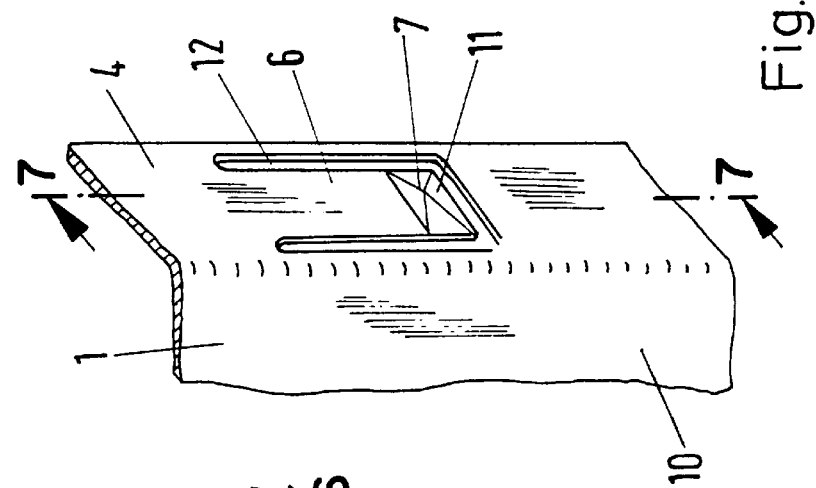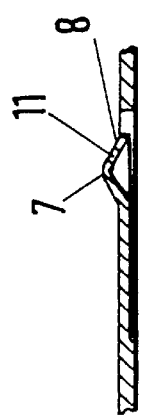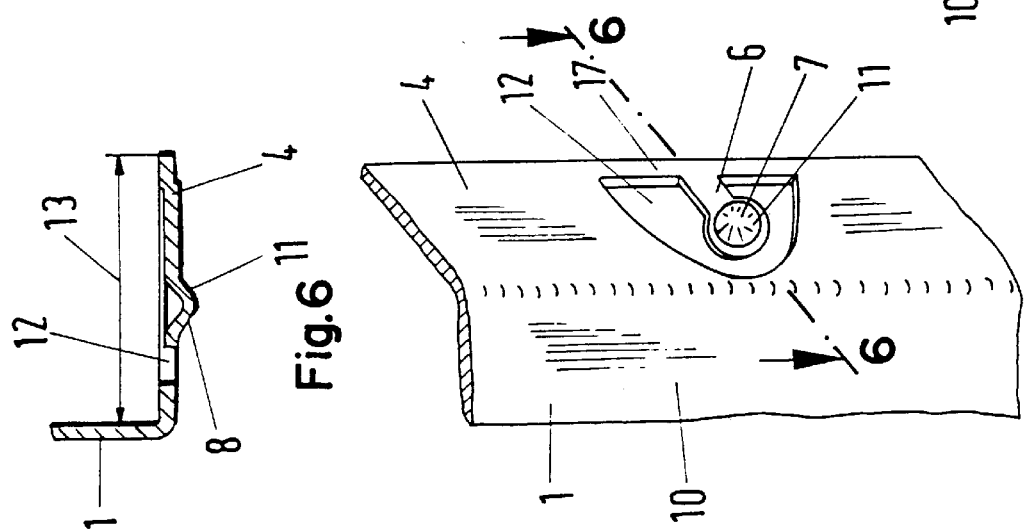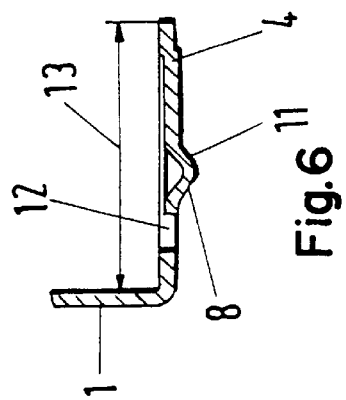

ELECTROMAGNETICALLY SCREENING PLUG-IN MODULES FOR ELECTRONIC RACKS

BACKGROUND OF THE INVENTION

The invention relates to a module carrier for electromagnetically screened, plug-in modules which carry a front plate having U-shaped limbs in order to maintain lateral contact to neighboring front plates with U-shaped limbs by using spring elements.

In the German utility model G 88 03 544.1 sheet metal spring strips are secured to the side limbs of front plates and indeed to the first limb of a front plate by means of a holding plate or directly, in order to make a contact to the free limb of a neighboring front plate at the side of the limb occupied by the spring sheet. An arrangement of this kind has the disadvantage that it requires a relatively high assembly cost and effort, and tight tolerances are necessary between the front plate side dimensions and the spring elements to be secured. Furthermore, the disadvantage exists that spring elements for the adjoining, spring-less limbs of front plates must be provided in the housing, or additional front plates must be provided with limbs provided with springs at both sides.

SUMMARY OF THE INVENTION

The present invention has the object of effecting the lateral screening of a front plate in a simple manner. This object is achieved in that front plates are cut out and bent from a metallic sheet in one piece and have U-shaped, inwardly turned limbs and spring elements on each limb.

This embodiment has the advantage that a universal limb shape and limb seal can be produced for the different width front plates using the set of tools for one limb and that the repetition accuracy of the front plates is large. Through the use of thin, resilient metallic sheets, such as for example steel sheets, the spring elements which are required for the contact pressure can be cut out to have the form of leaf springs, whereas the contact points project sideways beyond the profile of the limbs. The contact points can thereby be formed as pips by outwardly projecting bulges. Since the pips rise via an oblique surface or conically towards the contact point, the oblique surfaces first run up on the opposite side, when the front plate is moved into place, to thereby prestress the spring element and produce the requisite contact force when the contact point travels into its end position.

Through the vertical offset of the contact points between the left- and right-hand limbs of a screening plate it is possible, despite the cutting out of the leaf springs, to produce a relatively large density of contact points between two neighboring screening plates. Furthermore, the same tools can be used for working the left- and right-hand limbs, if these are point symmetrical to one another over a point of the central line of the screening plate. When the screening plates stand very close to one another at the side, the deformation path for a contact point can be produced by a run-in at the limb of the neighboring screening plate. Since, for neighboring screening plates, each of the two should be capable of being pushed into place relative to the other, already secured screening plate, it is sensible to provide a run-in at the inner side for a run-in at the front side in order to be independent of the installation sequence. In a case such as this similar push-in forces are achieved when the contact points are arranged approximately at the center of the depth of a limb and when the inclination of the run-in is the same from the inside as from the outside. With a limb of shallow depth this could lead to a leaf spring which is too short if the latter is arranged with its axis in the push-in direction. In such a case assistance can be provided with leaf springs having axes arranged transverse to the push-in direction or with leaf springs which are continued transverse to the push-in direction as doubly clamped torsion springs. When using laser cutting technology, it is indeed possible to cut out leaf springs through a spiral cut. The torsional force then increases in the spring arm with increasing distance from the center of the spiral spring with a contact point. By an appropriate choice of the spirals, the spring can be made softer towards the center. With very narrowly packed screening plates, the run-ins can also serve for the rough centering height-wise. One possibility consists in punching out the full screening plate from a stainless steel strip. Since such strips used for tools can have a relatively small wall thickness, it can be entirely sensible to mount additional plates or coatings with labelling or with decoration on the front side of the screening plates. These coatings need not necessarily be of metal; plastic plates or coatings are also conceivable.

Conventional punching and forming tools can be used to manufacture the described geometry. However, with thin, stainless steel sheets in particular, the laser cutting technology has been developed to such an extent nowadays that the cutting out of the screening plate with cut-outs is possible in a time of few minutes by a laser in combination with a digitally controllable cross table, whereas the bending operations and the plastic deformation of the side limbs and pips can be carried out using conventional forming techniques.

Small batch sizes and indeed one-off manufacture are possible with a subdivision into standardized side limbs, for which the bending and forming operations take place with punching and forming tools and into screening plates which are cut out with different widths by a laser.

BRIEF DESCRIPTION OF THE DRAWINGS

The invention will be described with reference to an embodiment shown in the following figures:

FIGS. 2 and 3 are schematic illustrations of different embodiments of side limbs with leaf springs, FIG. 4 is a schematic illustration of a pip with a leaf spring and, moved away from it sideways, a run-in from the outside and a run-in from the inside, FIG. 6 is a fragmentary, cross-sectional view taken along line 6—6 of FIG. 2, and FIG. 7 is a fragmentary, cross-sectional view and is taken on line 7—7 of FIG. 3.

DETAILED DESCRIPTION OF THE PREFERRED EMBODIMENTS

Figure 5:
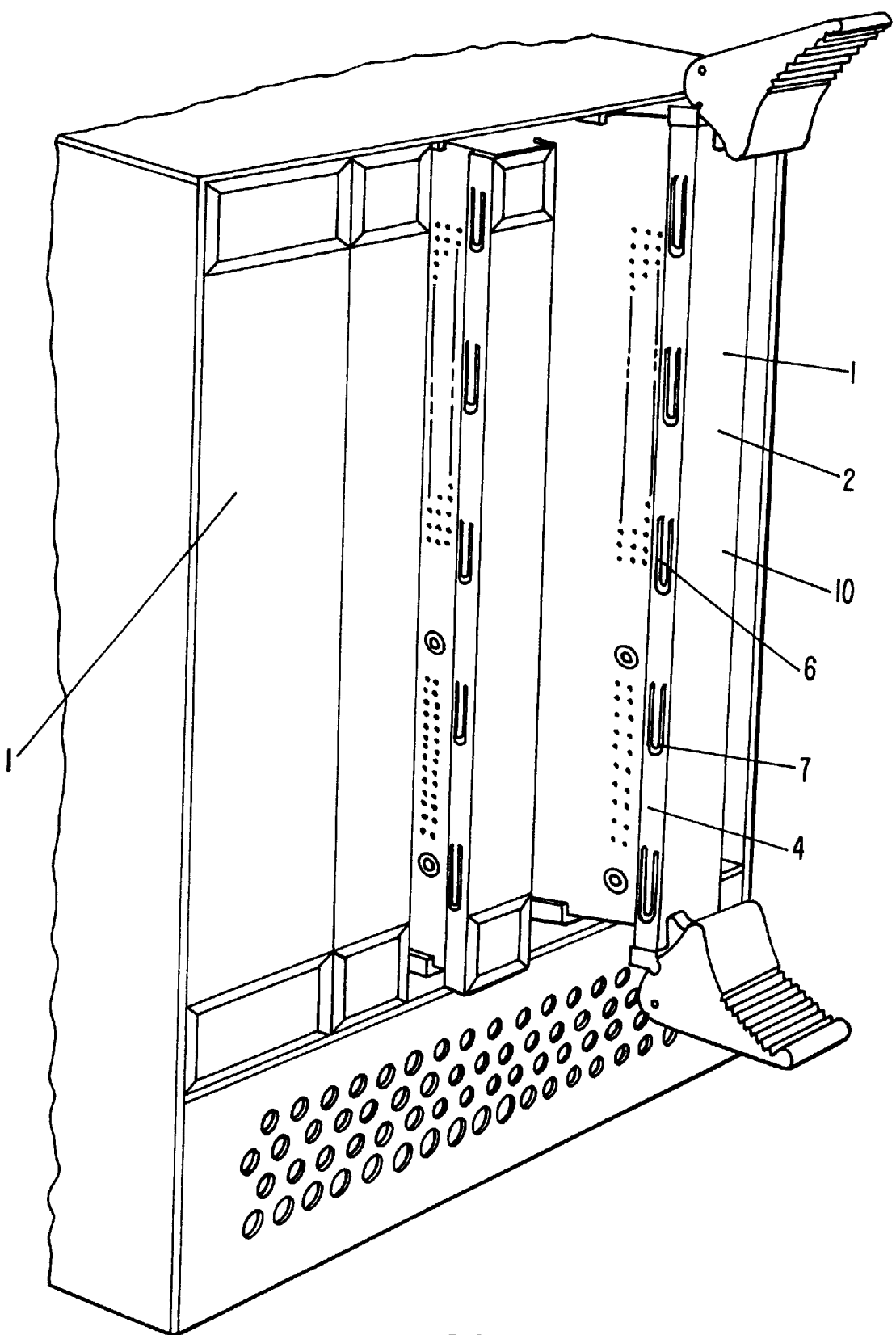
FIG. 5 is a fragmentary, perspective view of a rack with several, fully inserted plug-in units and with two cards and front plates of FIG. 3 being partially inserted.

The assembly of FIG. 5 shows the front side of a rack which has side panels 26 and a top plate 28. Two plug-in units 1 on the left side are fully inserted or seated so that only the front part of a screening plate 10 is visible. Two further plug-in units are partially inserted past card guides 20 which are fixed to the structure of the rack. The cards are mounted to the screening plates 10 with card holders 22. One plug-in unit can be actuated with handles 24. The U-shaped limbs 4 have leaf springs 6, which are arranged as is shown in FIG. 3, and which make contact with neighboring limbs when the unit is fully inserted or plugged in.

The figures show electromagnetically screened plug-in modules which carry a front plate that has U-shaped limbs 3, 3', 4, 4' with lateral spring elements 5 for the screening. It is possible, through the use of a suitable metallic sheet and a design of the limbs 3, 4 and spring elements 5 which is geometrically adapted thereto, to cut and bend screening plates 10, 10', limbs 3, 4 and the spring elements in one piece from sheet metal. If one can decide to use standardized limbs 3, 4 and spring elements with corresponding bending tools and if one effects the cutting out, for example, using a numerically controlled laser on a stainless sheet, then a high flexibility results for different dimensions of front plates and their efficient manufacture can be achieved even with small batch sizes.

Figure 1:
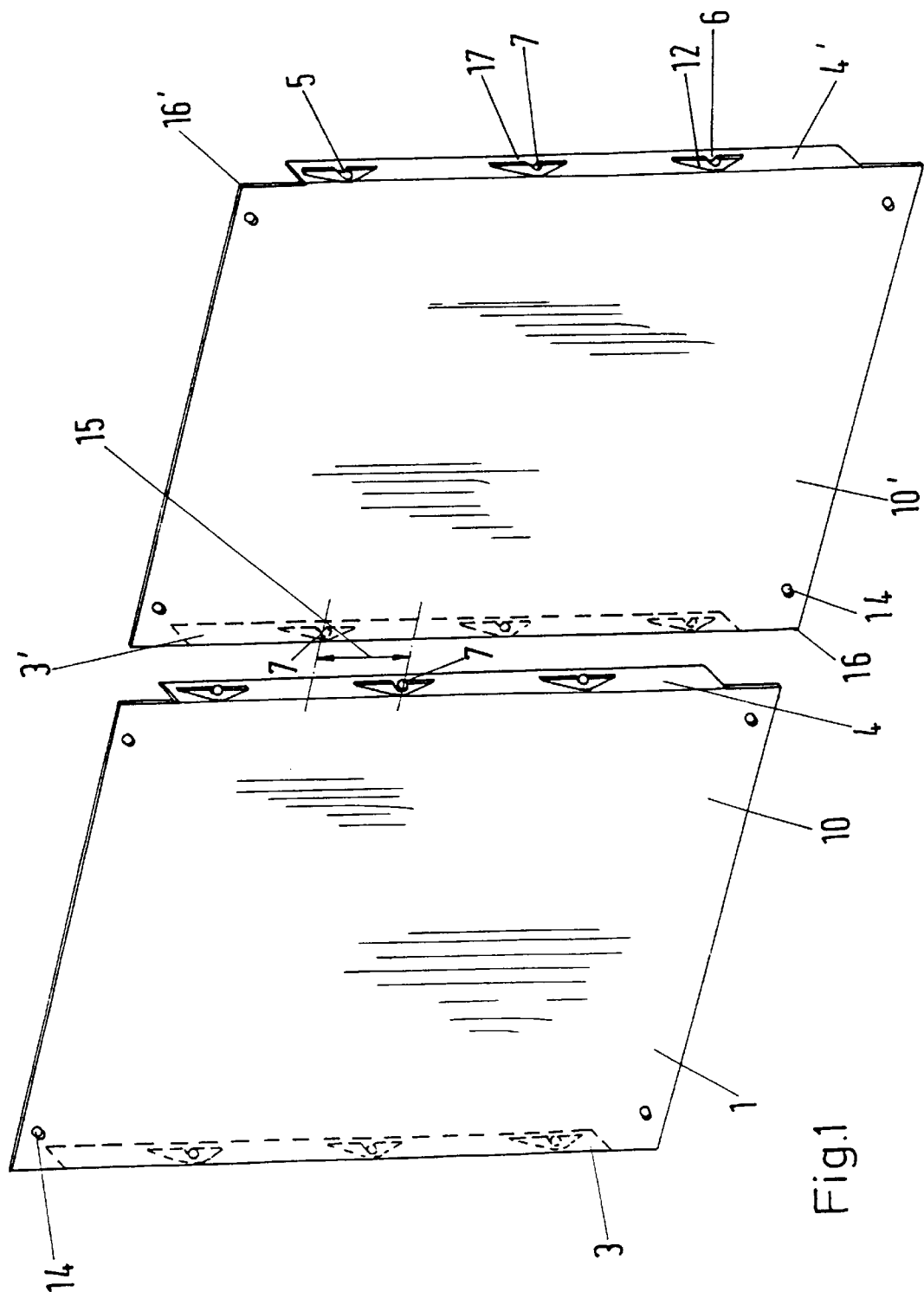
FIG. 1 is a schematic illustration of two neighboring screening plates which lie adjacent to one another in a frontal plane and which have been moved apart from one another sideways.

In FIG. 1 two screening plates 10, 10' have been cut out from a stainless sheet and provided with windows 12 in order to make it possible to cut out spring elements 5 in the form of leaf springs 6 with torsion spring parts 17. The actual contact points 7 at the end of the leaf springs 6 are formed as pips which project beyond the side profile. Visible mounting bores 14 are provided at the front side in order to connect the screening plates 10, 11, the rear sides of which are attached to plug-in modules (not shown here), to a housing (likewise not shown). In order to pick up the lateral forces which originate from the spring elements 5 at the front plates, the plug-in modules (not shown here) with the front plates are provided with positioning pins directed towards the housing which are guided in corresponding bores at the housing side on movement of the plug-in module with front plate into place. The bending operation for the pushing out of the pips and for the folding over of the limbs 3, 3', 4, 4' was done with forming tools. The left-hand limbs 3, 3' with their cutouts and spring elements 5 are point symmetric to the right-hand limbs 4, 4'. In this respect the contact points 7 are distributed so that with two screening plates 10, 10' lying alongside one another, the contact points 7 have a mutual displacement 15 relative to one another. This does not, however, signify that the corners 16, 16' of a screening plate 10' forming a diagonal must be a mirror-image of one another with respect to the same point. By way of example, rivet connections, screw connections, point welding or adhesively bonded connections are possible for the attachment between screening plates 10, 10' and their associated plug-in modules. The sheets can in particular be spot welded without problem.

FIG. 2 shows the transition at a screening plate 10 from the front side 1 to the right-hand limb 4 in which a window 12 has been cut out in such a way that, for example, a previously punched-out pip 8 (shown in FIG. 6) with a contact point 7 on a spring element remains in the form of a leaf spring 6 extending in the push-in direction, with the leaf spring 6 being continued by a torsion spring 17 clamped at both sides. This arrangement has the advantage that despite the short spring arm of the leaf spring 6 a relatively long spring path arises, on which no plastic deformation takes place, as a result of the continuation as a torsion spring. With this torsion spring component 17 it is possible to keep the depth 13 (shown in FIG. 6) of the side limbs very small. Pip 8 is so adapted in its height that when it disappears in the section of the limb 4 no overstraining of the spring element occurs. The pip 8 has oblique or conical surfaces 11, with which it runs up on a neighboring screening plate, or on a boundary of the housing, during a relative movement in the push-in direction in order to produce the necessary contact force. When the pip 8 is shaped as a spherical shell, a more uniform distribution of the push-in force arises, because the steeper portions first run up at a lower spring bias, whereas the slope becomes smaller as the spring bias increases.

In FIG. 3 there is shown a limb 4 with a leaf spring 6 with an axis that is transverse to the push-in direction. Pip 8 is illustrated as having a pyramidal shape.

In FIG. 4 there is shown a short bending spring 6 which is clamped at one end on one limb 3 and which at the opposite side can run up on a limb with a two-sided run-in 9, 9' in order to produce the required contact force. In this case the increase of the contact force is dependent on the angle of the run-in. Here it is also advantageous for an independent installation sequence if the contact point of the pip 8 lies in its end position approximately at the center of the depth of the opposing limb 4.

Quite generally, the selected thickness of the sheet metal and its limit of elasticity determine which design of the one-piece, shaped spring elements can be considered in order to take up fluctuations in the installation tolerances. With very thin metal sheets, such as for example metal sheets of spring material, it is conceivable to stiffen the screening plates 10, 10', at least on a part of the front side 1, using a cover, which does not need to be metallic, by clamping it between the cover and the plug-in module via tie elements such as screws. In actual fact, an adequate stiffening of the front side already arises through the attachment of the screening plates to the plug-in modules. In the vertical direction of the screening plates 10, 10' a stiffening is already achieved by the bent-over limbs 3, 4, 3', 4', whereas in the direction transverse to it the stiffness can be increased by horizontally extending beads. Inwardly formed beads also facilitate spot welding for an attachment, for example with stainless metal sheets.

I claim:

1. An electromagnetically screening plug-in unit for slidably moving the unit into and out of a rack and positioning the unit between spaced-apart, parallel walls when the unit is in the rack, the unit comprising a front plate having limbs extending transversely from the plate for maintaining contact with the walls when the unit is in the rack, and spring elements located at each limb of the front plate for slidably engaging the walls, the front plate, the limbs and the spring elements being cut and formed as one piece from a metallic sheet so that the front plate defines a screening plate having inwardly turned limbs and spring elements on each limb.

2. A plug-in unit in accordance with claim 1 wherein the spring elements comprise leaf springs having contact points defined by the inwardly turned limbs, the contact points projecting sideways beyond a cross-section of the limbs.

3. A plug-in unit in accordance with claim 2 wherein the contact points comprise projecting pips.

4. A plug-in unit in accordance with claim 3 wherein the contact points of the leaf springs in the respective limbs are displaced relative to one another in a longitudinal direction of the limbs for establishing contact with the walls.

5. A plug-in unit in accordance with claim 4 including a plurality of adjacent screening plates each having a transversely extending limb defining one of the walls, and wherein the respective limbs defining the walls each have a run-in surface positioned to be aligned with the contact points of the screening plate for producing a desired contact force between the contact points and the run-in surface.

6. A plug-in unit in accordance with claim 5 wherein each run-in surface of the walls has a funnel shape for approximately mutually aligning the adjacent screening plates by engaging the run-in surface and the contact points.

7. A plug-in unit in accordance with claim 6 wherein the limbs of each screen plate have a depth in a direction transverse to the front plate, and wherein the contact points are arranged approximately at a middle of the depth of one of the limbs of each front plate, and wherein the other of the limbs of each front plate has a run-in extending over the depth thereof for generating a contact force which, upon establishing contact between the contact points and the run-in surface, initially continuously increases with relative movement between adjacent plates irrespective of the direction of the movement.

8. A plug-in unit in accordance with claim 3 wherein the pips have inclined surfaces which engage the walls before the contact points engage the walls to progressively prestress the spring elements until the contact points engage the limb.

9. A plug-in unit in accordance with claim 1 including at least one of labelling and decoration on a front side of the screening plates.

10. A plug-in unit in accordance with claim 1 including a horizontal rib at a front side of the screening plate for stiffening.

11. A plug-in unit in accordance with claim 2 wherein the spring elements each comprise a bendable leaf spring and a torsion spring component.

12. An electromagnetically screening plug-in unit for installation in a rack holding a plurality of side-by-side plug-in units, the unit including a generally U-shaped plate defining a front portion and opposing, spaced-apart limbs extending transversely from the front portion; each limb including at least one cut-out shaped to form a spring element which generally lies in a plane of the limb and defines a contact point that projects past a cross-section of the limb for resiliently engaging surfaces proximate the limbs of the unit and thereby retaining the front plate in position relative to the surfaces, at least one of the surfaces being defined by a limb of another plug-in unit in the rack, the front portion, the limbs and the springs being formed of a single sheet of metal.

13. A plug-in unit according to claim 12 wherein the spring element is defined by a leaf spring and a torsion spring, the leaf spring and the torsion spring also being formed of the single metal sheet.

14. An electromagnetically screened rack including a housing with an open front and a plurality of plug-in units slidably insertable between an installed position in which the plug-in units are disposed in the housing and a removal position in which the plug-in unit is outside the housing and detached therefrom, the plug-in units forming an electromagnetic screen over the housing opening, each plug-in unit comprising a U-shaped front plate which partially covers the housing opening and first and second limbs extending from the front plate towards an interior of the housing, the front plate and the limbs being constructed of a metal sheet, the limbs having a length in a direction parallel to the front plate, opposing limbs of adjacent front plates being spaced apart and defining a gap between them, each limb of each front plate including a plurality of cut-outs shaped to form a spring element which generally lies in a plane of the limb and defines a contact point that projects past a cross-section of the limb and the gap and resiliently engages the opposing limb of the adjacent front plate to retain the front plate in position and electromagnetically screen the gap, the cut-outs being offset with respect to each other in the direct on of the length of the limbs so that the contact points of the spring elements on opposing limbs of adjacent plug-in units are offset from each other when the units are in their installed position.

* * * * *